United States Patent
Nielson et al.

Patent Number: 5,619,642
Date of Patent: Apr. 8, 1997

[54] FAULT TOLERANT MEMORY SYSTEM WHICH UTILIZES DATA FROM A SHADOW MEMORY DEVICE UPON THE DETECTION OF ERRONEOUS DATA IN A MAIN MEMORY DEVICE

[75] Inventors: Michael E. Nielson, Broomfield; William A. Brant; Gary Neben, both of Boulder, all of Colo.

[73] Assignee: EMC Corporation, Hopkinton, Mass.

[21] Appl. No.: 363,132

[22] Filed: Dec. 23, 1994

[51] Int. Cl.⁶ .................................................. G06F 11/00
[52] U.S. Cl. ........................ 395/182.04; 395/185.05; 395/185.07; 395/183.18
[58] Field of Search ................................. 395/575, 425, 395/182.03, 182.04, 182.05, 185.05, 183.18, 185.02, 185.07, 185.06, 182.06; 371/13, 10.1, 10.2, 67.1, 51.1, 40.1, 99.1

[56] References Cited

U.S. PATENT DOCUMENTS

| | | | |
|---|---|---|---|
| 3,422,402 | 1/1969 | Sakalay | 371/10.1 |
| 3,544,777 | 12/1970 | Winkler | 371/10.1 |
| 5,155,845 | 10/1992 | Beal et al. | 395/575 |
| 5,159,671 | 10/1992 | Iwami | 395/575 |
| 5,177,744 | 1/1993 | Cesare et al. | 371/10.1 |
| 5,185,748 | 2/1993 | Fujimura | 371/68.1 |
| 5,185,877 | 2/1993 | Bissett et al. | 364/200 |
| 5,202,887 | 4/1993 | Ueno et al. | 371/10.1 |
| 5,212,784 | 5/1993 | Sparks | 395/575 |
| 5,239,637 | 8/1993 | Davis et al. | 371/10.2 |
| 5,255,270 | 10/1993 | Yanai et al. | 371/10.1 |
| 5,363,502 | 11/1994 | Kagimasa et al. | 371/10.1 |
| 5,412,671 | 5/1995 | Tsuchiya | 371/51.1 |

*Primary Examiner*—Robert W. Beausoliel, Jr.
*Assistant Examiner*—Joseph E. Palys
*Attorney, Agent, or Firm*—David N. Caracappa

[57] ABSTRACT

A fault tolerant memory system is disclosed which includes a main memory device, storing data and an associated error detecting code, and a shadow memory device, storing data corresponding to the data stored in the main memory. A multiplexer, selectively couples data from either the main memory device or the shadow memory device to an output terminal in response to a control signal. A controller reads the data and associated error detecting code from the main memory device and the corresponding data from the shadow memory device, and generates the multiplexer control signal such that the multiplexer couples data from the shadow memory device to the output terminal if the data from the main memory device is not the same as the data from the shadow memory device and the error detecting code indicate an error in the data from the main memory device, and otherwise couples the data from the main memory device to the output terminal.

6 Claims, 4 Drawing Sheets

FAULT TOLERANT MEMORY SYSTEM WHICH UTILIZES DATA FROM A SHADOW MEMORY DEVICE UPON THE DETECTION OF ERRONEOUS DATA IN A MAIN MEMORY DEVICE

The present invention relates to a fault tolerant memory system adapted for use as a cache memory in a RAID disk array.

It is often required that very important data in a computer system or network remain secure from loss despite the failure of a component in the computer system or network. For example, if the data is stored on a mass storage device, such as a magnetic disk drive, it is possible for that device to fail e.g. because of a read/write head crash, or failure of the power supply. It is also possible for the data stored on the disk drive to become corrupted e.g. by the deterioration of the magnetic coating on the disk platters. In either of these situations, it is important in such systems that the data be recoverable, and not lost.

One known system for providing security for data stored in a mass storage device is a RAID (redundant array of inexpensive disks) subsystem. In one arrangement of such a subsystem, termed RAID 5 in the art, write data plus error detecting and correcting (EDC) code information, is stored on a plurality of different disk drives in the array in such a manner that even if one disk drive ceases to function, the data can still be retrieved. In a RAID subsystem the computer system or network writes data to a controller for the RAID subsystem. The controller encodes the write data with associated EDC code information, allocates the encoded data and EDC information to respective sectors on respective disk drives according to the known RAID 5 scheme, and writes the encoded data to the allocated sectors in the array of disk drives. Data is read by an inverse operation. The computer system or network requests that data be read from the RAID subsystem. The RAID controller reads data and EDC code information from appropriate respective sectors on the respective disk drives, checks the EDC code information, corrects any detected errors, and returns the data to the computer system or network.

The process of EDC encoding write data, allocating the encoded data to the sectors on the disk drives, and writing the data to the disk drives takes some amount of time. To allow the processing element(s) of the host computer system to return to other processing as soon as possible, a read/write memory (RAM) cache is provided in some known RAID controllers. The host computer system supplies the data to be written to the RAID to such a RAID controller. The RAID controller, in turn, transfers this data to the cache RAM, which is a relatively high speed operation. When the data has been saved in the cache RAM, the host computer system may return to other processing tasks. The RAID controller then retrieves the data from the cache RAM, EDC encodes it, allocates the encoded data to respective sectors on respective disk drives, and stores it in the disk array, which is a relatively slow operation. The cache RAM arrangement speeds the process of writing data to the RAID for the host computer system, and is referred to as a fast write process.

To provide some measure of fault tolerance in the cache RAM, an EDC encoder and decoder is included as a part of the cache RAM in some implementations of known RAID controllers. In such implementations whenever data is written to the cache RAM, EDC code information, associated with the write data, is generated and stored in the cache RAM, along with the write data. When data is to be retrieved from the cache RAM, the desired data and its associated EDC code information is decoded, and if any errors have occurred, they are detected; and if they are small enough, are corrected.

However, if only one cache RAM is provided, a failure of that RAM would result in loss of data. In order to provide further fault tolerance, some known host computer systems include redundant RAID controllers, attached to respective redundant host computer system buses, in which each controller includes its own cache RAM with an EDC encoder and decoder. Each controller can, by itself, access the array of disks making up the RAID should the other controller fail. In operation, one controller is the operational controller and the other is the backup controller. The host computer system provides the write data to the operational controller. The operational controller EDC encodes the write data and stores it in its own cache RAM. Before the host computer system is informed that the fast-write process is complete, the operational controller provides a copy of the write data to the backup controller, which EDC encodes it and writes it in its own cache RAM. This permits the backup controller to start operating should the operational controller fail. This controller-to-controller transfer commonly takes place over a relatively slow SCSI bus, known as a back-end SCSI bus. When the data has been successfully transferred from the operational controller to the backup controller, the host computer system is informed that the fast-write process is complete.

An alternative approach to providing fault tolerance for write data in a RAID system is to provide a non-RAID disk drive to temporarily hold the cached write data. When the RAID controller receives write data, it EDC encodes the write data and stores it in its cache RAM, then transfers a copy to the non-RAID disk drive as a backup. When the data has been successfully written to this disk drive, the host computer system is informed that the fast-write process is complete. Both of these arrangements are relatively slow, the first because the write data must be transferred from the operational controller to the backup controller over a relatively slow back-end SCSI bus, and the second because write data must be transferred from the controller to the disk drive via a relatively slow disk write operation. In addition, EDC encoders and decoders are relatively expensive and complex parts. A system is desirable that can provide fault tolerant storage of write data in redundant cache RAMs without requiring slow controller-to-controller or controller-to-disk transfers and without requiring expensive EDC encoders and decoders.

In accordance with principles of the present invention, a fault tolerant memory system includes a main memory device, storing data and an associated error detecting code, and a shadow memory device, storing data corresponding to the data stored in the main memory. A multiplexer, selectively couples data from either the main memory device or the shadow memory device to an output terminal in response to a control signal. A controller reads the data and associated error detecting code from the main memory device and the corresponding data from the shadow memory device, and generates the multiplexer control signal such that the multiplexer couples data from the shadow memory device to the output terminal if the data from the main memory device is not the same as the data from the shadow memory device and the error detecting code indicate an error in the data from the main memory device, and otherwise couples the data from the main memory device to the output terminal.

Such a memory system provides a fault tolerant redundant memory system without requiring expensive EDC encoders and decoders, and without requiring any relatively slow transfers of data.

Figure 1:
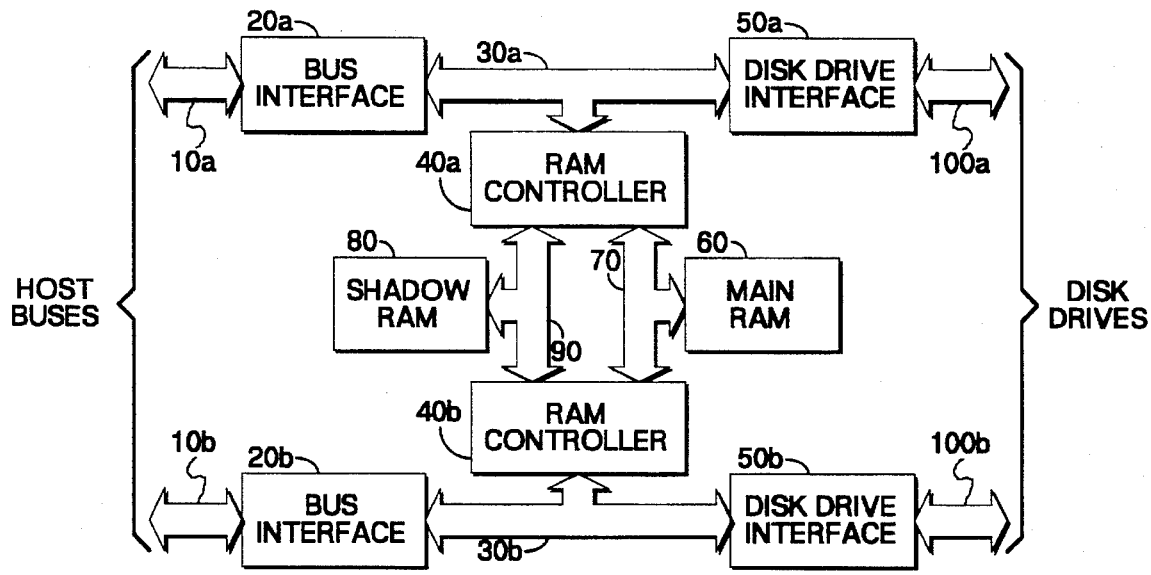
FIG. 1 is a block diagram of a portion of a RAID controller incorporating a fault tolerant memory system in accordance with the present invention.

The present invention will be described below in relation to a fault tolerant memory system adapted for use in a cache RAM for fast writes in a RAID controller. It should be understood that this fault tolerant memory system may be used anywhere where such a system is required. In the illustrated embodiment, the memory devices are read/write memories (RAMs) fabricated on an integrated circuit (IC) chip, but this memory system may use any type of memory devices, including, for example, mass storage devices such as magnetic disk drive devices.

In the drawing, multibit digital data paths are illustrated as wide arrows, with wider arrows representing signal paths carrying more bits. These multibit digital data paths may include control and clocking signals, in addition to data. Other multibit and single bit digital and analog signal paths, carrying data, control and/or clock signals are present but not illustrated in order to simplify the drawing. In addition, various clock generating and synchronizing elements, and delay and/or latching elements, necessary to properly synchronize the operation of the RAID controller, are also not illustrated. One skilled in the art of digital circuit design will understand where such elements are required and how to construct and interconnect them.

FIG. 1 is a block diagram of the portion of a RAID controller incorporating a fault tolerant memory system in accordance with the present invention. In FIG. 1, redundant I/O buses 10a and 10b are coupled to the host computer system (not shown). For example, the host buses 10a and 10b may be known fast-wide SCSI buses, emanating from a known fault tolerant SCSI adapter (also not shown) in the host computer system. The host buses are coupled to first bidirectional terminals of redundant bus interface circuits 20a and 20b, respectively. Second bidirectional terminals of the bus interface circuits 20a and 20b are coupled to redundant local buses 30a and 30b, respectively. For example, the local buses 30a and 30b may be known PCI buses. The local buses 30a and 30b are coupled to respective first bidirectional terminals of redundant RAM controllers 40a and 40b and redundant disk drive interface adapters 50a and 50b. The redundant disk drive interface adapters 50a and 50b have second bidirectional terminals coupled to respective disk drives (not shown) through redundant disk drive buses 100a and 100b. For example, redundant buses 100a and 100b may be known fast SCSI buses.

The redundant RAM controllers 40a and 40b, each also have a main RAM bidirectional terminal and a shadow RAM bidirectional terminal. The respective main RAM bidirectional terminals are coupled together, and to a main RAM 60, by a main RAM interface bus 70; and the respective shadow RAM bidirectional terminals are coupled together, and to a shadow RAM 80, by a shadow RAM interface bus 90. The main RAM 60 and shadow RAM 80, in combination, operate as a cache RAM in the illustrated RAID controller.

Only the portion of the RAID controller relating to the present invention is shown. Other components are included in the RAID controller of FIG. 1, but are not illustrated. For example, a resident processor, with associated read/write memory (RAM), read only memory (ROM) and non-volatile memory, and including further I/O adapters, is included, and coupled to the illustrated components via the local buses 30a and 30b through bus interface circuits in a known manner. The RAID controller operates under the control of this resident processor. For example, in the illustrated embodiment, the resident processor may be an LR33000 processor manufactured by LSI Logic, Milpitas, Calif. The requirements for such components, and their construction, interconnection and connection to illustrated components are known to one skilled in the art of RAID controller design and implementation, and they will not be illustrated or described in detail here.

In operation, the redundant host buses 10a and 10b, bus interface circuits 20a and 20b, local buses 30a and 30b, RAM controllers 40a and 40b, disk drive interface adapters 50a and 50b, and disk drive buses 100a and 100b, operate identically, so the operation of the controller will be described with reference to only one set, those in the upper portion of FIG. 1, and designated with the "a" suffix. Under the control of the resident processor (not shown) the bus interface 20a is conditioned to accept RAID commands, e.g. a RAID write request or a RAID read request. The resident processor controls the components of the RAID controller based on the received request. For example, when a RAID write request is received, the bus interface 20a, and RAM controller 40a are conditioned to accept the received write data, and place it in the main RAM 60 and shadow RAM 80. According to the present invention, data written to the main RAM 60 has error detection code information included with it. The shadow RAM 80 contains only the write data.

Figure 2:
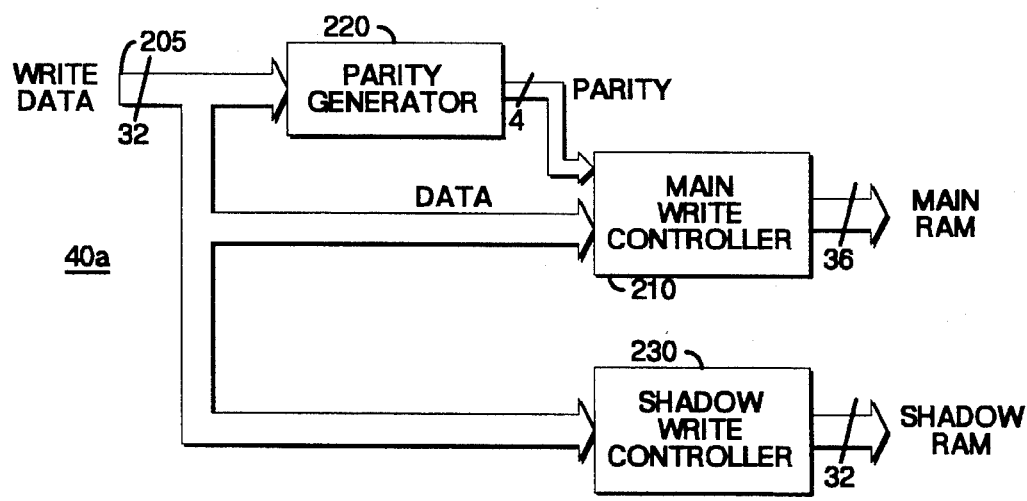
FIG. 2 is a more detailed block diagram of circuitry in the RAID controller illustrated in FIG. 1 for writing data into the fault tolerant memory.

FIG. 2 is a block diagram of a portion of the circuitry in the redundant RAM controller 40a for writing data into the cache memory illustrated in FIG. 1. Circuitry for providing control, timing and refresh signals to, and for receiving status signals from, the main RAM 60 and shadow RAM 80 is well known and is not shown. One skilled in the art will understand what signals are required, how to generate them, and provide them to the main RAM 60 and shadow RAM 80. In FIG. 2, write data is received from the local bus 30a at a 32-bit input terminal 205. Input terminal 205 is coupled to respective input terminals of a main RAM write controller 210 and an associated parity generator 220, and a shadow RAM write controller 230. A four-bit output terminal of the parity generator 220 is coupled to a second input terminal of the main RAM write controller 210. A 36-bit output terminal of the main RAM write controller is coupled to a data input terminal of the main RAM 60 (of FIG. 1) via the main RAM interface bus 70. The main RAM 60, therefore, is a 36-bit wide RAM in the illustrated embodiment. A 32-bit output terminal of the shadow RAM write controller 230 is coupled to an input terminal of the shadow RAM 80 via the shadow RAM interface bus 90. The shadow RAM 80, therefore, is a 32-bit wide RAM in the illustrated embodiment.

In operation, a 32-bit wide data word is received from local bus 30a at the input terminal 205. This data word is supplied to the parity generator 220. Within the parity generator 220, the 32-bits of data are partitioned into four groups of eight bits each and an even parity bit is generated for each group to form four nine-bit parity groups. Alternatively, an odd parity bit could be appended. The parity generator 220 may, for example, be constructed in known manner by four trees of exclusive OR gates. The four parity bits from the parity generator 220 are combined with the 32 data bits from the local bus 30*a* to form a 36-bit parity encoded word. This word is written into a location in the main RAM 60, as determined by the resident processor (not shown) by the main RAM write controller 210. Simultaneously, the 32 data bits from the local bus 30*a* are written into a corresponding location in the shadow RAM 80, also as determined by the resident processor, by the shadow RAM write controller 230. Thus, a 36-bit parity-encoded word is written into the main RAM 60, while only the 32-bit data portion of the same word is written into the shadow RAM 80.

In the illustrated embodiment, it is desired to protect the integrity of the data against at least a single point failure in the RAID controller. One possible source of a single point failure is the failure of a RAM IC chip in the cache RAM. It is known that a parity code can accurately detect no more than a single incorrect bit, thus, it desirable that the bits making up the parity groups, described above, be stored in respectively different RAM IC chips. This requires that bits in the words stored in the main RAM 60 be specially allocated to RAM IC chips making up the main RAM 60 to achieve this goal. Because only the main RAM 60 includes parity code bits, only bits in the main RAM must be properly allocated in this manner; the shadow RAM 80 is not parity encoded, so there is no need to specially allocate its bits to RAM IC chips.

Figure 3:
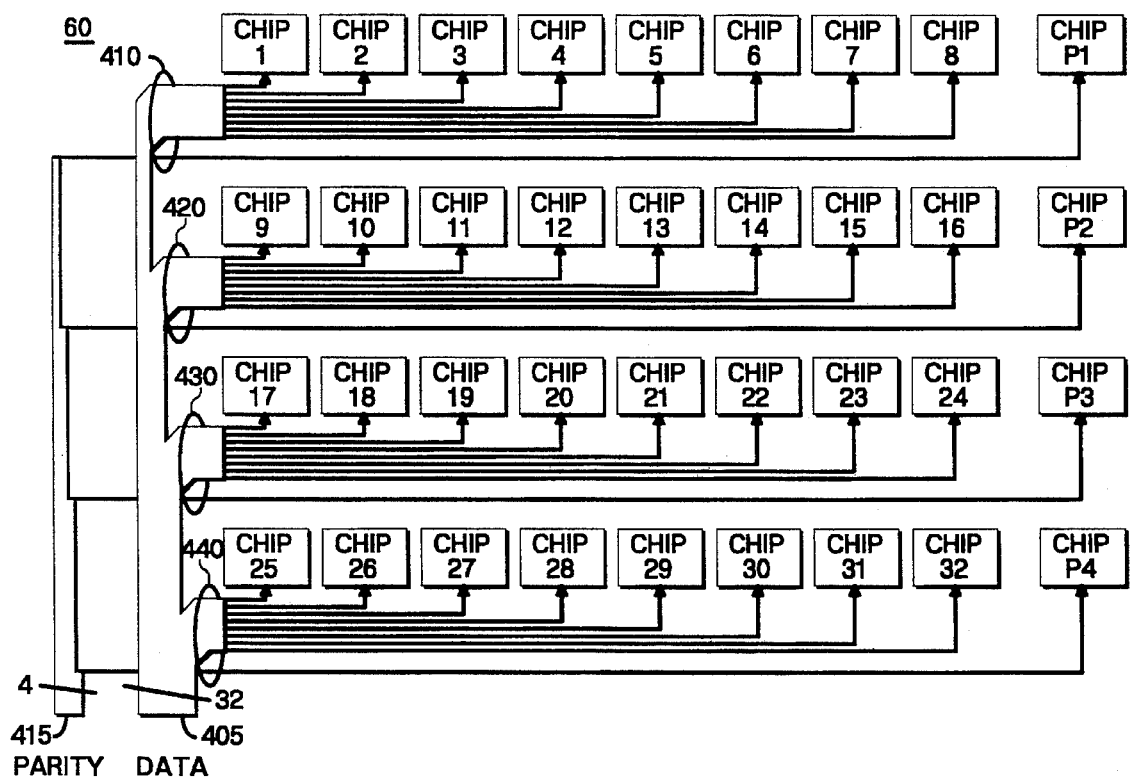
FIG. 3 and FIG. 4 are block diagrams illustrating the allocation of data and parity bits to memory chips of different configurations in the main RAM of the fault tolerant memory system illustrated in FIG. 1.
Figure 4:
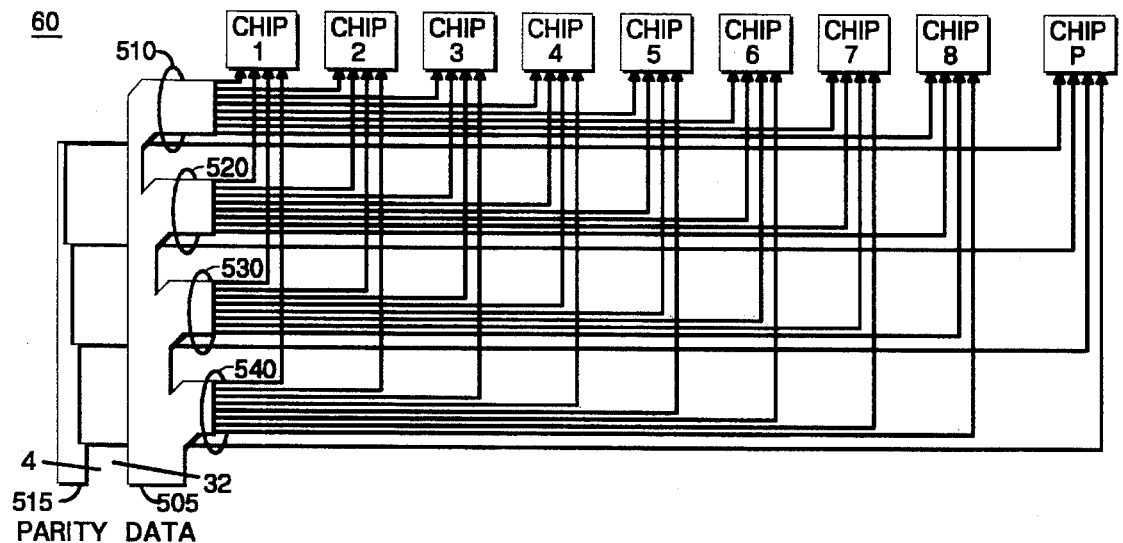

FIG. 3 and FIG. 4 are block diagrams illustrating the allocation of data and parity bits to respective RAM IC chips in the main RAM 60 (of FIG. 1). In FIG. 3, RAM IC chips having single-bit data input terminals, and in FIG. 4 those having four-bit data input terminals, are illustrated. One skilled in the art of memory system design will understand that, although not illustrated, address input terminals, data output terminals (or bidirectional data input/output terminals) and other control input and status output terminals are present on such RAM IC chips, and will understand what signals are required or produced by those terminals, and how to generate or process those signals, respectively. One skilled in the art of memory system design will also understand how to interconnect a plurality of RAM IC chips, having their data input terminals connected in parallel (not shown), in order to increase the memory storage capacity of the main RAM 60.

In FIG. 3, 36 RAM IC chips are illustrated (CHIP 1–CHIP 32 & CHIP P1–CHIP P4), each having a plurality of storage locations, and each storage location storing a single bit of data, known as by-one RAM IC chips. An input terminal 405 is coupled to receive 32 data bits, and an input terminal 415 is coupled to receive four parity bits, from the main RAM write controller 210 (of FIG. 2) of the RAM controller 40*a*. The 32 bits from input terminal 405 are coupled to respective data input terminals of a corresponding 32 RAM IC chips, CHIP 1–CHIP 32, and the four bits from input terminal 415 are coupled to respective data input terminals of a corresponding four RAM IC chips CHIP P1–CHIP P4.

Specifically, the top row of RAM IC chips (CHIP 1–CHIP P1) receives and stores the nine bits in the first parity group 410, described above. Chips CHIP 1–CHIP 8 respectively store the eight-bit data portion, a first bit in CHIP 1, a second bit in CHIP 2, and so forth; and CHIP P1 stores the parity bit associated with those data bits. The second row of RAM IC chips (CHIP 9–CHIP P2) receives and stores the nine bits in the second parity group 420. Chips CHIP 9–CHIP 16 respectively store the eight-bit data portion, and chip P2 stores the parity bit associated with those data bits. Similarly, the third row of chips (CHIP 17–CHIP P3) and the fourth row of chips (CHIP 25–CHIP P4) store the third 430 and fourth 440 nine-bit parity groups, respectively. As can be seen, each bit in any single parity group is stored in a respectively different RAM IC chip in the main RAM 60, so the failure of a single chip may be correctly detected by a parity code.

In FIG. 4, nine RAM IC chips (CHIP 1–CHIP 8 & CHIP P) are illustrated, each having a plurality of storage locations, and each storage location storing four bits of data, known as by-four RAM IC chips. An input terminal 505 is coupled to receive 32 data bits, and an input terminal 515 is coupled to receive four parity bits, from the main RAM write controller 210 (of FIG. 2) of the RAM controller 40*a*. The 32 bits from input terminal 505 are coupled to respective data input terminals of the eight RAM IC chips CHIP 1–CHIP 8, and the four bits from input terminal 515 are coupled to respective input terminals of RAM IC chip CHIP P.

Specifically, first input terminals of RAM IC chips CHIP 1–CHIP P) receive and store the nine bits in the first parity group 510, described above. The first input terminals of chips CHIP 1–CHIP 8 respectively store the eight-bit data portion, a first bit to the first input terminal of chip CHIP 1, a second bit to the first input terminal of chip CHIP 2, and so forth; and the parity bit associated with those data bits to the first input terminal of chip CHIP P. The second input terminals of RAM IC chips CHIP 1–CHIP P receive and store the nine bits in the second parity group 520. The second input terminals of RAM IC chips CHIP 1–CHIP 8 respectively store the eight-bit data portion, and the second input terminal of RAM IC chip CHIP P stores the parity bit associated with those data bits. Similarly the third and fourth data input terminals of the RAM IC chips CHIP 1–CHIP P store the third 530 and fourth 540 nine-bit parity groups, respectively. Again, as can be seen, each bit in any single parity group is stored in a different RAM IC chip, so the failure of a single RAM IC chip may be correctly detected by a parity code.

One consequence of forming data groups which include bytes (eight bits) of data is that a single byte of a four-byte word may be written to the cache RAM, without requiring that the other bytes of that word be written as well. This provides additional flexibility and speed in writing data to the cache RAM.

As described above, in response to a RAID write request, the host processor writes a block of data, consisting of a predetermined number of 32 bit data words, into the cache RAM using the write circuitry illustrated in FIG. 2, under the control of the resident processor in the illustrated RAID controller. When the block of data has been written into the cache RAM, the host processor resumes other processing. The resident processor then begins to read the cached data block from the cache RAM, EDC encode it, and prepare it for transfer to an appropriate sector on an appropriate disk drive in the disk drive array.

Figure 5:
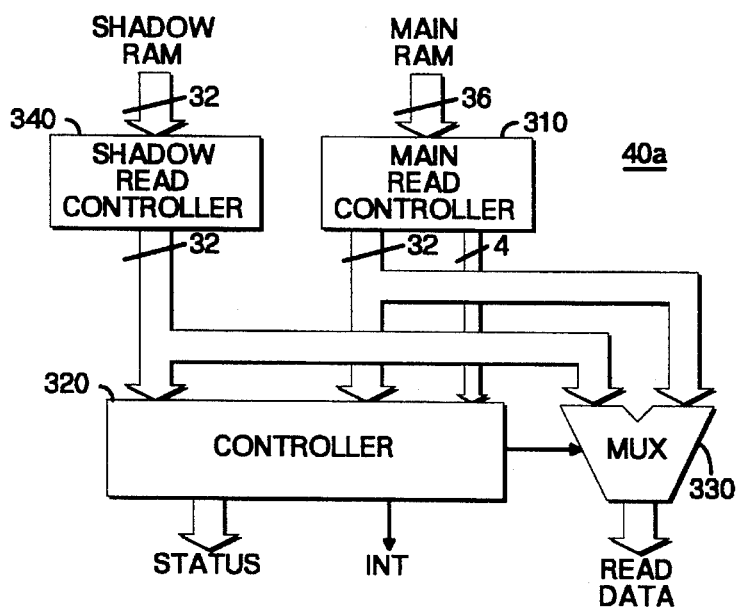
FIG. 5 is a more detailed block diagram of circuitry in the RAID controller illustrated in FIG. 1 for reading and correcting data from the fault tolerant memory.

FIG. 5 is a block diagram of circuitry in the RAM controller 40*a* for reading correct data from the main RAM 60 and shadow RAM 80 (of FIG. 1). In FIG. 5, the main RAM 60 provides a 36-bit signal, representing data read from the main RAM 60 under control of the resident processor (not shown), to an input terminal of a main RAM read controller 310. A 32-bit data output terminal of the main RAM read controller 310 is coupled to respective input terminals of a controller 320, and a multiplexer 330. A four-bit parity output terminal from the main RAM read controller 310 is coupled to a second input terminal of the controller 320. An output terminal of the multiplexer 330 produces data read from the cache RAM, formed from the main RAM 60 and shadow RAM 80. The read data output terminal of the multiplexer 330 is coupled to the local bus 30a (of FIG. 1), and provides a 32-bit data word from the cache RAM to the local bus 30a.

The shadow RAM 80 provides a 32-bit data signal, representing data read from the shadow RAM 80, to an input terminal of a shadow RAM read controller 340. A 32-bit data output terminal of the shadow RAM read controller 340 is coupled to a third input terminal of the controller 320 and a second data input terminal of the multiplexer 330.

The controller 320 provides a control signal to a control input terminal of the multiplexer 330. A status output terminal (STATUS) of the control circuit 320 produces signals representing the status of the process of reading data from the main RAM 60 and shadow RAM 80. An interrupt output terminal (INT) of the control circuit 320 produces an interrupt signal as described below. The status output terminal, STATUS, and interrupt output terminal, INT, are coupled to the resident processor in a known manner. For example, in the illustrated embodiment, signals representing the status are stored in registers which are accessible to the resident processor through execution of I/O instructions, all in known manner. In addition, the interrupt output terminal INT is coupled to the interrupt subsystem of the resident processor, also in known manner.

Referring to FIG. 2, above, when data is written to the RAID controller to be stored in the disk array, it is written temporarily to the cache RAM, consisting of the main RAM 60 and the shadow RAM 80 (of FIG. 1). As described above, in the illustrated embodiment each 36-bit data word in the main RAM 60 consists of a 32-bit data portion and an associated four-bit parity portion, partitioned into four nine-bit parity groups, each group consisting of an eight-bit data group and an associated even parity bit. In the shadow RAM 80, each 32-bit word contains only data. Referring now to FIG. 5, a 36-bit word is read from the main RAM 60 and a 32-bit word is read from the shadow RAM 80 by the main RAM read controller 310 and shadow RAM read controller 340, respectively, in known manner, under control of the resident processor (not shown). The 32-bit data portion from the main RAM 60 is compared to the 32-bit data from the shadow RAM 80 in the controller 320. Under normal conditions, when no errors have occurred, the result of this comparison will indicate that the respective 32-bits of data from the main RAM 60 is the same as the data from the shadow RAM 80. In this case, the controller 320 generates a signal for the control input terminal of the multiplexer 330 which conditions the multiplexer 330 to couple the 32-bit data signal at its first data input terminal, from the main RAM controller 310, to the read data output terminal. In addition, signals at the status output terminal STATUS are generated indicate that no errors have occurred.

If, however, the result of the comparison in the controller 320 indicates that a there is a difference between the respective data retrieved from the main RAM 60 and the shadow RAM 80 (of FIG. 1), then an error has occurred in the storage and retrieval of the data from the cache RAM. In this case, some form of corrective action must be taken, depending upon the nature of the error. One aspect of the nature of the error is the extent of the difference between the data retrieved from the main RAM 60 and the shadow RAM 80. As is known, a parity code can properly detect no more than single bit errors. If the comparison described above indicates that no more than a single bit is different between the main RAM 60 and the shadow RAM 80 within any parity group, then a check of the parity in the main RAM 60 can indicate which RAM holds good data. In this case, the controller 320 performs this parity check function across the combined 32-bit data portion and four-bit parity portion retrieved from the main RAM 60.

If the parity check indicates that there is no parity error in the data retrieved from the main RAM 60, then it assumed that the data retrieved from the main RAM 60 is good data, and the data retrieved from the shadow RAM 80 is corrupted. The controller 320, thus, generates a control signal for the multiplexer 330 which conditions the multiplexer 330 to couple the 32-bit data signal at its first data input terminal, i.e. from the main RAM controller 310, to the read data output terminal. Then the signals at the status output terminal are adjusted to indicate that an error has occurred but was corrected. In addition, an interrupt signal is generated at the interrupt output terminal. This interrupt is supplied to the processor which responds in a manner described in more detail below.

If, however, the parity check indicates that there is a parity error in the data retrieved from the main RAM 60, then it is assumed that the data retrieved from the main RAM 60 is corrupted and the data retrieved from the shadow RAM 80 is good data. The controller 320, thus, generates a control signal for the multiplexer 330 which conditions the multiplexer 330 to couple the 32-bit data signal at its second data input terminal, i.e. from the shadow RAM controller 340, to the read data output terminal. In this case as well, the signals at the status output terminal are adjusted to indicate that an error has occurred but was corrected, and an interrupt signal is generated at the interrupt output terminal.

If the comparison of the 32-bit data portion from the main RAM 60 to the 32-bit data from the shadow RAM 80, described above, indicates more than one bit different between the main RAM 60 and the shadow RAM 80 within any parity group, then it is not possible to correctly determine whether either the main RAM 60 or the shadow RAM 80 contains uncorrupted data. In such a case, the RAID controller has failed, and the read process is aborted. Signals at the status output terminal are adjusted to indicate that an uncorrectable error has occurred, and an interrupt signal is generated at the interrupt output terminal.

The resident processor (not shown) responds in the following manner to the various results of a cache RAM read, described above. When no read error occurs, the resident processor processes the retrieved data in a normal manner. If an error occurred but was corrected, then correct data was received by the resident processor. But an interrupt from controller 320 is detected by the resident processor, caused by the signal generated at the interrupt output terminal INT of controller 320, as described above. In order to determine an appropriate course of action, the status signals from the status output terminal STATUS of controller 320 must be read. The interrupt handler, executed in a known manner by the resident processor in response to the received interrupt, reads the status signals via execution of an appropriate I/O instruction by the resident processor. In this case, the status signals indicate to the resident processor that an error occurred but was corrected. This error could be either a soft error, which does not repeat and does not indicate a hardware failure; or a hard error, which does repeat and indicates a hardware failure.

When the resident processor determines from the status signals that a corrected error has occurred, it writes the correct data just received from the cache RAM back into the same location in the cache RAM from which it was just retrieved. Then the resident processor reads that same location from the cache RAM again. If this read is successful, the previous error was a soft error, indicating no hardware failure. The previously incorrect data in the cache RAM (either the main RAM 60 or shadow RAM 80) was corrected by the write operation performed by the interrupt handler, as indicated by the subsequent successful read operation. Thus, all data in the controller is now accurate, and processing may continue in the normal manner. It is also possible to provide circuitry to automatically write the correct data, e.g. from the read data output terminal (of FIG. 5), back into the cache RAM, e.g. via the write data input terminal 205 (of FIG. 2), when a corrected error is detected, independently of the resident processor.

If, however, the subsequent read of the data from the cache RAM by the interrupt handler results in another error, this indicates a hard error, indicating a hardware failure. In this case, the resident processor takes steps to shut down the operation of this RAID controller and transfer control to the redundant controller (not shown). When the processor determines from the status signals that an uncorrectable error has occurred, it immediately takes steps to shut down the operation of this RAID controller, and transfer control to the redundant controller.

Figure 6:
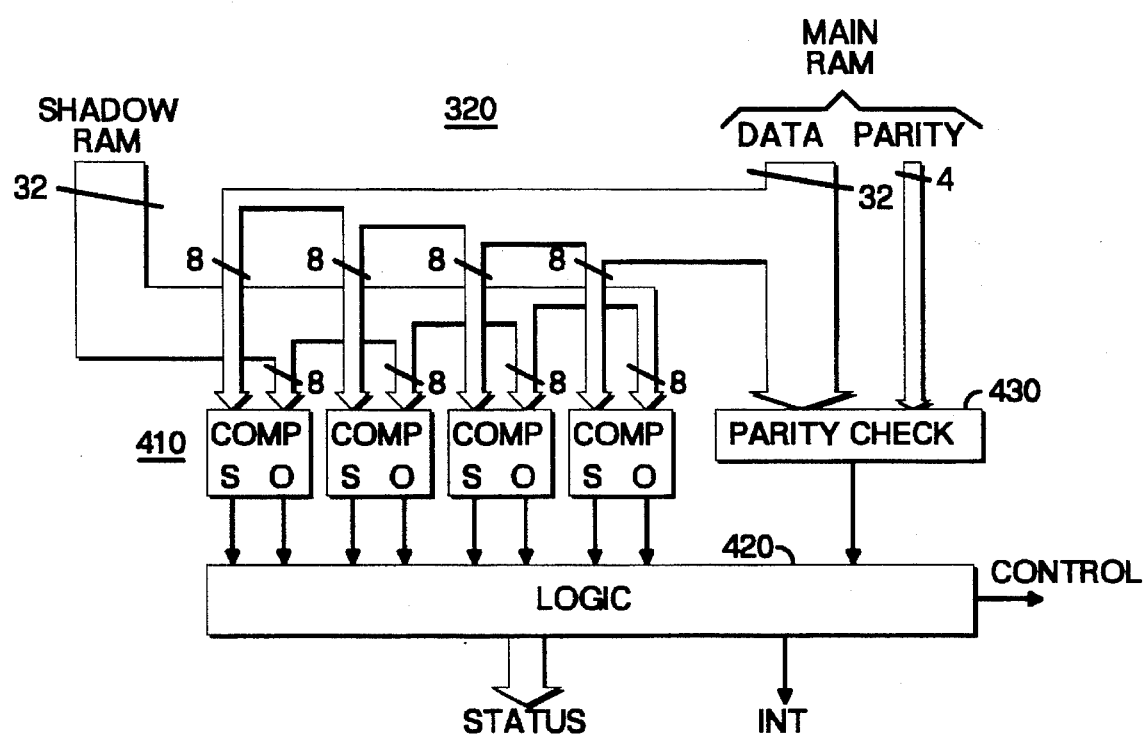
FIG. 6 is a more detailed block diagram of a controller illustrated in FIG. 5.

FIG. 6 is a more detailed block diagram of the controller 320 illustrated in FIG. 5. In FIG. 6 the 32-bit data portion of the data retrieved from the main RAM 60 (of FIG. 1) is coupled to a first input terminal of a parity checking circuit 430, and is partitioned into the four eight-bit data groups described above, and the four eight-bit data groups are supplied to respective first input terminals of four comparing circuits, denoted collectively as 410. The four-bit parity portion of the main RAM 60 data is coupled to a second input terminal of the parity checking circuit 430. An output terminal of the parity checking circuit 430 is coupled to an input terminal of a logic circuit 420. The 32-bit data retrieved from the shadow RAM 80 is partitioned into eight-bit data groups corresponding to those of the main RAM 60, and supplied to second input terminals of corresponding ones of the comparing circuits 410.

Each of the four comparing circuits 410 has two single bit output terminals: a first, S, for generating a signal indicating that the two eight-bit data words at its first and second input terminals are the same, and a second, O, generating a signal indicating that only one bit is different between the words at its input terminals. The respective S and O output terminals of the four comparing circuits 410 are coupled to corresponding input terminals of the logic circuit 420. The logic circuit 420 produces at a control output terminal (CONTROL) the control signal for the multiplexer 330 (of FIG. 5). The logic circuit 420 also produces the status signals and interrupt signal at a status output terminal STATUS and interrupt output terminal INT respectively.

In operation, when respective 32-bit data words are retrieved from the main RAM 60 and shadow RAM 80 (of FIG. 1), they are compared to each other in parallel in four eight-bit data groups in the four comparing circuits 410. Each comparing circuit produces a logic "1" signal at its S output terminal if the values of the two eight-bit groups at its respective input terminals are the same, and a logic "0" otherwise; and produces a logic "1" signal at its O output terminal if only one bit is different between the two eight-bit data groups at its respective input terminals, and a logic "0" signal otherwise. One skilled in the art of digital logic design will be able to design and construct a comparing circuit which will perform the above-described function. Such a circuit may be a combinatorial logic circuit, and may be constructed from discrete logic components, or as a part of a PLA or ASIC.

The parity checking circuit 430 operates in a known manner to generate a logic "1" signal at its output terminal if the combined data and parity portions of the data from the main RAM 60 have even parity (as they should) and a logic "0" signal otherwise. (Or, as has been described above, the desired parity may be odd parity, in which case the parity checking circuit would produce a logic "1" signal when the combined data and parity portions have odd parity, and a logic "0" signal otherwise.) Such a parity checking circuit is very well known in the art, and will not be described in detail here. Such a circuit may be a combinatorial logic circuit, and may be constructed from discrete logic components, or as a part of a PLA or ASIC. In response to the respective signals from the S and O output terminals of the four comparing circuits 410, and the signal from the parity checking circuit 430, the logic circuit 420 generates the control signal (CONTROL) for the multiplexer 330 (of FIG. 5), the status signals and the interrupt signal. As described above, in the illustrated embodiment, the status signals are written into registers accessible to the resident processor via I/O instructions, and the interrupt signal (INT) is supplied to the interrupt subsystem of the resident processor, both in known manners. One skilled in the art of digital logic design will be able to design and construct a circuit for generating these status signals and the interrupt signal.

In the illustrated embodiment, the multiplexer 330 (of FIG. 5) operates in the following manner. If the signal at its control input terminal, supplied by the control output terminal of the logic circuit 420, has a logic "1" value, then the multiplexer 330 couples the data from the main RAM 60 to the read data output terminal; if the signal at its control input terminal has a logic "0" value, the multiplexer 330 couples the data from the shadow RAM 80 to the read data output terminal. The logic circuit 420 is arranged so that if the signals from all four S output terminals of the comparing circuits 410 are simultaneously logic "1" signals (indicating that the respective 32-bit data words from the main RAM 60 and shadow RAM 80 are the same), the signal at the control output terminal is made a logic "1" signal. This causes the multiplexer 330 to couple the data from the main RAM 60 to the read data output terminal. In this case, status signals are written into the status register to indicate that no error has occurred, and no interrupt signal is generated.

If the signal from the S output terminal of any of the comparing circuits 410 is a logic "0" signal, but the signal from the O output terminal of that same comparing circuit is a logic "1" signal, this indicates that a miscomparison has occurred, but that only a single bit is different between the main RAM 60 and the shadow RAM 80 within that data group. In this case the parity information may be used to identify the correct version of the data. In this situation, if the signal from the parity checking circuit 430 is a logic "1" (indicating good parity), then the signal at the control output terminal is made a logic "1" signal. This causes the multiplexer 330 to couple the data from the main RAM 60 to the read data output terminal. If the signal from the parity checking circuit 430 is a logic "0" signal, (indicating bad parity), then the signal at the control output terminal is made a logic "0" signal. This causes the multiplexer 330 to couple the data from the shadow RAM 80 to the read data output terminal. In either case, status signals are written into the status register to indicate that an error was detected but corrected, and an interrupt signal is generated.

If the signals at both the S and O output terminals of any one of the four comparing circuits 410 are logic "0" signals, this indicates that a miscomparison of more than one bit has occurred between the main RAM 60 and the shadow RAM 80 within that data group. In this situation, it is not possible to determine whether either the main RAM 60 or the shadow RAM 80 contains correct data. In this case, the read operation is aborted, and status signals are written into the status register to indicate that an uncorrectable error was detected, and an interrupt signal is generated.

In a RAID controller according to the present invention, an error of any number of bits between the main RAM 60 and shadow RAM may be detected, and up to four bits may be corrected, provided they occur in different parity groups in the main RAM 60. This may be done without requiring expensive EDC encoders and decoders, and without requiring slow controller-to-controller or controller-to-disk transfers.

There are enhancements which may be made to the illustrated embodiment. For example, an error detecting code, such as a parity code, may also be included in the shadow RAM 80 (of FIG. 1). In such a case, referring to FIG. 2, a second parity generator, corresponding to parity generator 220, would be coupled between the write data input terminal 205 and a second input terminal of the shadow RAM write controller 230, and would append, e.g. four parity bits to the 32 data bits being written to the shadow RAM 80 by the shadow RAM write controller 230. Correspondingly, referring to FIG. 6, a second parity checking circuit, corresponding to parity checking circuit 430 would be responsive to the data and the parity bits from the shadow RAM 80, and would generate an output signal coupled to the logic circuit 420. The second parity checking circuit would generate at its output terminal a logic "1" signal when the parity of the data read from the shadow RAM 80 is correct, and a logic "0" signal otherwise. This signal would be used by the logic circuit 420 to decide which of the main RAM 60 or shadow RAM 80 will be coupled to the read data output terminal, in a similar manner to that described above.

A further enhancement is that additional parity bits may be used to provide enhanced error detection for the main RAM 60 (of FIG. 1). In the illustrated embodiment, 32 data bits are partitioned into four data groups of eight bits each, and a parity bit is allocated to each one of the data groups to make four nine-bit parity groups, a total of 36 bits. It is possible, for example, to partition the 32 data bits into eight four-bit data groups with a parity bit allocated to each data group to form eight five-bit parity groups. This arrangement would require a 40-bit main RAM 60. Referring to FIG. 2, parity generator 220 would generate eight parity bits at its output, and the combination of these eight parity bits and the 32 data bits would be written to the 40-bit main RAM 60 by the main RAM write controller 210. Referring to FIG. 5, 40 bits would be received from the main RAM 60 by the main RAM read controller 310, with 32 bits of data and eight parity bits being supplied to the controller 320. Referring to FIG. 6, the 32 bits of data from the main RAM 60 and the shadow RAM 80 would be partitioned into eight four-bit groups, and supplied to eight four-bit comparing circuits 410. The logic circuit 420 would receive eight S and O signals from the respective comparing circuits 410 and would generate the control signal for the multiplexer 330 (of FIG. 5) in a similar manner to that described above.

In addition, RAM IC chips having different configurations may be used in the main RAM 60 (of FIG. 1). For example, future RAM IC configurations may be by-eight RAM IC chips, i.e. each RAM IC chip would include eight data input terminals. In order to maintain the allocation of no more than one bit from any parity group to a single RAM IC, this would require that 32 bits of data be partitioned into eight four-bit data groups, with eight parity bits, as described above. Referring to FIG. 4, four by-eight RAM IC chips (e.g. CHIP 1–CHIP 4) would each have eight input terminals, and a fifth by-eight RAM IC chip (e.g. CHIP P) would have eight input terminals to receive the eight parity bits. The 32 bits of data from the main RAM 60 (input terminal 505) would be partitioned into eight four-bit groups. The eight parity bits (c.f. input terminal 515) would be allocated to respective ones of the eight data groups to form eight five-bit parity groups (c.f. 510,520,530,540). A first bit from each of the eight parity groups would be supplied respective ones of the eight input terminals of the first RAM IC chip (c.f. CHIP 1), a second bit from each of the eight parity groups would be supplied to respective ones of the eight input terminals of the second RAM IC chip (c.f. CHIP 2), and so forth. The eight parity bits would be supplied to respective ones of the eight input terminals of the fifth RAM IC chip (CHIP P). When arranged in this manner, still, no more than one bit in a parity group is allocated to a single RAM IC chip.

Another enhancement is the use of an EDC encoder and decoder, such as a Hamming code encoder and decoder, with the main RAM 60 (of FIG. 1). This may be of possible use if it would be required to add eight parity bits because of the configuration of the RAM IC chips, as described above. An EDC code for a 32 bit data word requires 7 check bits, for a total of 39 bits, which is comparable with the 40-bit parity coded words described above. Referring to FIG. 2, this would entail substituting a Hamming code generator for the parity code generator 220. Referring to FIG. 6, this would entail substituting a Hamming code checking circuit for the parity checking circuit 430. A Hamming code checking circuit generates three output signals, a first indicating that no error exists in a code word, a second indicating that an error was detected but is correctable, and a third indicating that an uncorrectable error was detected. These three signals would be supplied to the logic circuit 420, which would generate a control signal for the multiplexer 330 (of FIG. 5) in a similar manner to that described above, based on these signals. While this arrangement includes an EDC encoder and decoder in the cache RAM, an arrangement according to the present invention still offers the advantage that only a single EDC circuit is required for a redundant cache RAM: for the main RAM 60 alone and not for the shadow RAM 80. An arrangement according to the present invention also retains the advantage of not requiring relatively slow controller-to-controller or controller-to-disk transfers of data.

As another enhancement, the 32-bit multiplexer 330 (of FIG. 5) may be partitioned into four independently controlled eight-bit multiplexers, each responsive to a respective control signal. Respective ones of these multiplexers will be associated with respective comparing circuits 410 (of FIG. 6). The two sets of eight-bit data at the data input terminals of each multiplexer will be same data as at the two sets of eight-bit input terminals of the comparing circuit 410 associated with that multiplexer. The logic circuit 420 (of FIG. 6) will evaluate the S and O signals from the each of the comparing circuits 410 independently, and will generate a control signal for the associated multiplexer in a similar manner to that described above.

What is claimed is:

1. A fault tolerant memory system, comprising:
   a main memory device, storing data and an associated parity checking code;
   a shadow memory device, storing data corresponding to the data stored in the main memory;
   a multiplexer, responsive to a control signal having a first state for coupling data from the main memory device to an output terminal, and responsive to the control signal having a second state for coupling data from the shadow memory device to the output terminal; and
   a controller comprising:
      a comparator having a first input terminal responsive to the data from the main memory device, a second input terminal responsive to the data from the shadow memory device, a first output terminal producing a first output signal having a first state when the data from the main memory device is the same as the data from the shadow memory device and a second state otherwise, and a second output terminal producing a second output signal having a first state when only a single bit is different between the data from the main memory device and the data from the shadow memory device, and a second state otherwise;
      a parity error detecting circuit having a first input terminal responsive to the data from the main memory device, a second input terminal responsive to the associated error detecting code from the main memory device, and an output terminal producing a signal having a first state when an error is detected, and a second state otherwise; and
      a logic circuit having a first input terminal responsive to the first output terminal of the comparator, a second input terminal responsive to the second output signal of the comparator, a third input terminal coupled to the output terminal of the parity error detecting circuit, and an output terminal which generates the control signal having the first state when the first output signal from the comparator has the first state, generates the control signal having the first state when the first output signal from the comparator has the second state, the second output signal from the comparator has the first state, and the signal from the error detecting circuit has the second state, generates the control signal having the second state when the first output signal from the comparator has the second state, the second output signal from the comparator has the first state, and the signal from the error detecting circuit has the first state, and generates a status signal, indicating an uncorrectable-read-error when both the first and second output signals from the comparator have the second state.

2. A fault tolerant memory system, comprising:
   a main memory device, storing data partitioned into a plurality of data groups, each data group having a parity bit associated with it;
   a shadow memory device, storing data corresponding to the data stored in the main memory, and partitioned into a plurality of data groups respectively corresponding to data groups in the main memory device;
   a multiplexer, responsive to a control signal having a first state for coupling data from the main memory device to the output terminal, and responsive to the control signal having a second state for coupling data from the shadow memory device to the output terminal; and
   a controller, comprising:
      a comparator having a plurality of comparing circuits each responsive to a respective one of the corresponding data groups in the main memory device and the shadow memory device, for generating a first output signal having a first state when the corresponding data groups from the main memory device and the shadow memory device are the same and a second state otherwise, and a second output signal having a first state when only a single bit is different between the corresponding data groups from the main memory device and the shadow memory device, and a second state otherwise;
      a parity checking circuit having a first input terminal responsive to the data from the main memory device, a second input terminal responsive to the associated parity code from the main memory device, and an output terminal producing a signal having a first state when an error is detected, and a second state otherwise; and
      a logic circuit, responsive to the first and second output signals of the plurality of comparing circuits, having an input terminal coupled to the output terminal of the parity checking circuit, and having an output terminal producing the control signal having the first state when the first output signal from any one of the comparing circuits has the second state, the second output signal from the one of the comparing circuits has the first state, and the signal from the parity checking circuit has the second state and generates the control signal having the second state when the first output signal from any one of the comparing circuits has the second state, the second output signal from the one of the comparing circuits has the first state, and the signal from the parity checking circuit has the first state.

3. The system of claim 2 wherein the logic circuit further generates a status signal indicating a corrected-read-error when the first output signal from any one of the comparing circuits has the second state, the second output signal from the one of the comparing circuits has the first state, and the signal from the parity checking circuit has the second state or when the first output signal from any one of the comparing circuits has the second state, the second output signal from the one of the comparing circuits has the first state, and the signal from the parity checking circuit has the first state.

4. The system of claim 2 wherein the logic circuit further generates an interrupt signal when the first output signal from any one of the comparing circuits has the second state, the second output signal from the one of the comparing circuits has the first state, and the signal from the parity checking circuit has the second state or when the first output signal from any one of the comparing circuits has the second state, the second output signal from the one of the comparing circuits has the first state, and the signal from the parity checking circuit has the first state.

5. The system of claim 2 wherein the logic circuit further generates a status signal indicating an uncorrectable-read-error when both the first and second output signals from any comparing circuit have the second state.

6. The system of claim 2 wherein the logic circuit further generates an interrupt signal when both the first and second output signals from any comparing circuit have the second state.

* * * * *